(12) United States Patent
Nagata

(10) Patent No.: US 8,590,281 B2
(45) Date of Patent: Nov. 26, 2013

(54) METHOD FOR HERMETICALLY CLOSING AN AIR-TIGHT BAG FOR PELLICLE

(75) Inventor: Yoshihiko Nagata, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 280 days.

(21) Appl. No.: 13/067,165

(22) Filed: May 13, 2011

(65) Prior Publication Data

US 2011/0280503 A1    Nov. 17, 2011

(30) Foreign Application Priority Data

May 17, 2010    (JP) .................................. 2010-112917

(51) Int. Cl.
*B65D 33/24*    (2006.01)
*B65B 3/04*    (2006.01)

(52) U.S. Cl.
USPC .............................................. 53/469; 53/482

(58) Field of Classification Search
USPC ............ 53/284.7, 371.7, 372.2, 372.5, 372.7, 53/373.3, 374.7, 375.2, 375.5, 375.7, 469, 53/482, 491; 493/157
See application file for complete search history.

(56) References Cited

U.S. PATENT DOCUMENTS

| | | | | |
|---|---|---|---|---|
| 917,124 A | * | 4/1909 | Pierson | 426/413 |
| 2,023,682 A | * | 12/1935 | Higginbottom | 53/415 |
| 2,035,656 A | * | 3/1936 | Kath | 138/119 |
| 2,070,838 A | * | 2/1937 | Orstrom | 53/482 |
| 2,257,243 A | * | 9/1941 | Meyer-Jagenberg | 53/482 |
| 2,433,056 A | * | 12/1947 | Masci | 53/425 |
| 3,655,118 A | * | 4/1972 | Rinecker | 383/62 |
| 4,603,537 A | * | 8/1986 | Pace | 53/415 |
| 4,697,701 A | * | 10/1987 | Ying | 206/316.1 |
| 5,322,095 A | * | 6/1994 | Bolz | 141/83 |
| 6,379,949 B1 | * | 4/2002 | Ward | 435/304.1 |
| 6,996,952 B2 | * | 2/2006 | Gupta et al. | 53/434 |
| 2010/0221146 A1 | * | 9/2010 | Matheyka | 422/20 |
| 2011/0258967 A1 | * | 10/2011 | Dietrich, Jr. | 53/432 |
| 2012/0052161 A1 | * | 3/2012 | Woodham | 426/106 |

FOREIGN PATENT DOCUMENTS

JP    01117745 A  *  5/1989    ............... A23F 5/08

* cited by examiner

*Primary Examiner* — Hemant M Desai
(74) *Attorney, Agent, or Firm* — Manabu Kanesaka

(57) ABSTRACT

There is provided a method for air-tightly enclosing a pellicle case in a filmy bag which protects the pellicle case against dust without the use of a plurality of bags or without modifying the filmy bag except for folding it like origami and eventually consolidating with an adhesive material: in short the opening of the bag is folded a number of times compactly.

7 Claims, 3 Drawing Sheets

F I G. 1
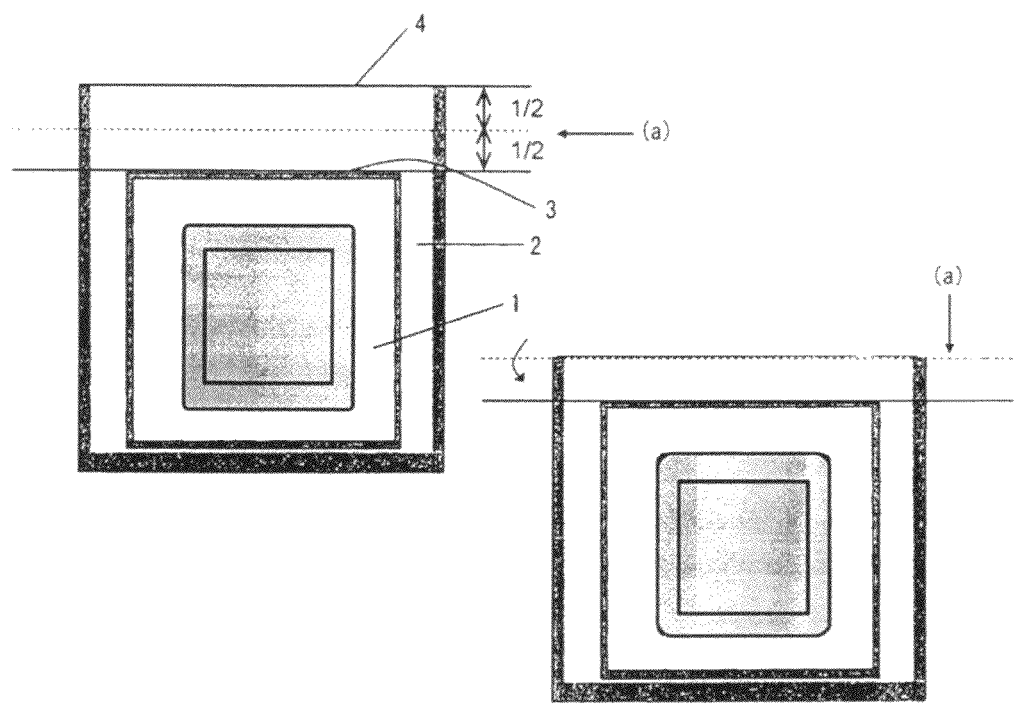

F I G. 2
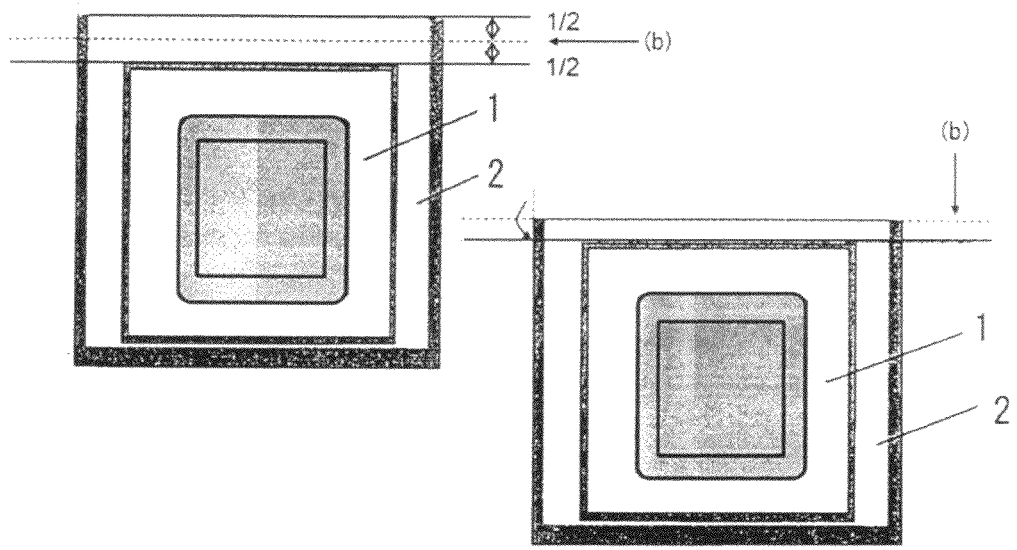
F I G. 3
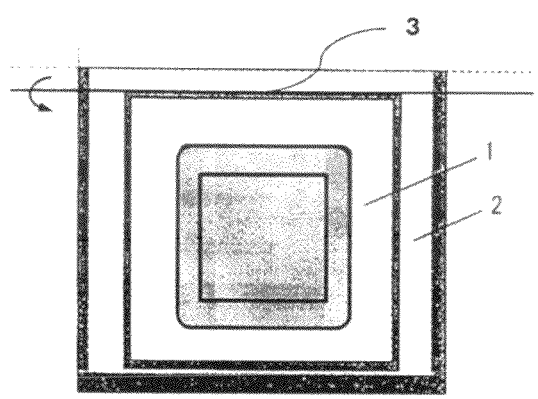

F I G. 4
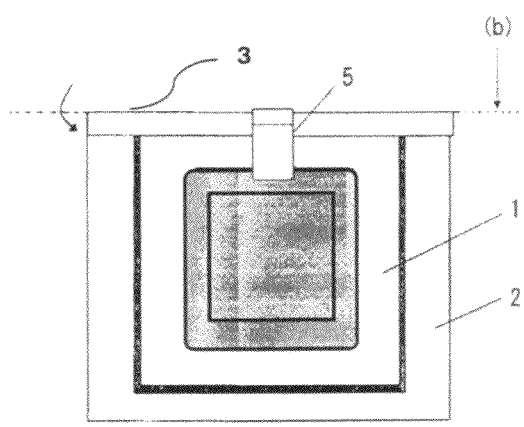

METHOD FOR HERMETICALLY CLOSING AN AIR-TIGHT BAG FOR PELLICLE

The present non-provisional application claims priority under 35 U.S.C. §119(a) from Japanese Patent Application No. 2010-112917 filed on May 17, 2010, the entire disclosure of which is hereby incorporated by reference.

FIELD OF THE INVENTION

This invention relates to a method for hermetically enclosing in an air-tight bag a product (especially an encased pellicle), the manufacturing of which is completed in a clean room.

TECHNICAL BACKGROUND OF THE INVENTION

A product of which the manufacturing process is completed in a clean room, for example a pellicle (hereinafter when the explanation only refers to a pellicle, it should be taken as an example representing other such products), often ends up with being contained in a container specially designed for the particular product, such as a pellicle case; however, if the container is brought out of the clean room as it is, the container is liable to attract the dust in the air so that when the container is brought into a clean room and opened for the removal of the pellicle, the pellicle may collect some of the dust from the container and some other part of the dust may soil the clean room as well.

Hence, a pellicle encased is usually shipped, on account of this fact, after being wrapped in two or more bags made of an air-tight film material, the innermost bag containing the encased pellicle and being inside the next innermost bag and so on, so as to avoid dust, and when, for example, a pellicle is to be brought in a clean room for use, the outermost bag is removed immediately before the bagged pellicle is brought into the clean room.

In order to keep clean a pellicle manufactured in a clean room as well as its container, it is necessary to pack them with a careful attention, and to this end, heretofore, a packing bag has been hermetically closed by being sealed with heat, or has been provided with a zipper (such as a rail fastener) for secure closing, or has had its mouth completely sealed with an adhesive tape. Furthermore, two or more of these procedures have been combined to achieve a perfectly sealed packaging for shipment.

However, while the product is safe from being contaminated thanks to the faultless packaging, the multi-bag packaging, especially when the number of the bags exceeds three or four, renders the opening operation troublesome and in a case where a bag is thermally sealed, a person opening the package must use a pair of scissors or a knife so that extra tools are in need and what is more the cut face would become a new source of contaminant particles. Also, in the case of a bag with a zipper, the cost is increased and the zipper would allow some foreign particles to pass through it.

SUMMARY OF THE INVENTION

Problems the Invention Seeks to Solve

In view of the above circumstances, it is an object of the present invention to provide a method for hermetically enclosing a product in a package bag whereby foreign materials are shut out, no extra tools to are required, and the retrieval of the product from the package is easy.

Means to Solve the Problems

One aspect of the method according to the present invention, which is for air-tightly containing in a film bag a flat product within a clean room, comprises the steps of inserting the product into the bag and then folding that part of the bag which includes the opening two or more times in a same direction and consolidating the folded bag with an adhesive means thereby preventing unfolding of the bag.

Also the method according to the present invention for air-tightly containing in a rectangular film bag a flat product having at least one pair of parallel sides comprises the steps of:
(i) inserting, within a clean room, the product into the bag in a manner such that one of the parallel sides of the product comes to a bottom end side of the bag,
(ii) folding the bag over a line that runs equidistant from the open end side of the bag and the other one of the parallel sides of the product,
(iii) folding the bag in the same direction as in the step (ii) over a line that runs equidistant from the crease line over which the bag has been folded immediately previously and said the other one of the parallel sides of the product, this step being conducted at least one time, and
(iv) consolidating the folded bag with an adhesive means thereby preventing unfolding of the bag.

What is Achieved by the Invention

As the result of the invention, it has become possible to open and close a hermetic film bag with ease and convenience in a manner such that, when closed, no atmospheric air can enter the bag and, when being opened, there is no need for an extra device to open it and thus no worry for contaminants from such a device, although the opening and closing operation is done merely by folding and unfolding the bag.

BRIEF DESCRIPTION OF THE DRAWINGS

FIG. 1 is a pair of drawings in sequence which illustrates how a bag for an encased pellicle is first folded, showing the line over which the first folding is done in broken line and the direction in which the folding is done by a curved arrow.

FIG. 2 is a pair of drawings in sequence which illustrates how the bag is secondarily folded, showing the line over which the second folding is done in broken line and the direction of the secondary folding by a curved arrow.

FIG. 3 is a drawing which illustrates how the bag is tertiarily folded, showing the line over which the tertiary folding is done and the direction of the tertiary folding by a curved arrow.

FIG. 4 is a drawing illustrating how the bag may be consolidated after the foldings with an adhesive tape, which is the final step of the method of the invention.

DETAILED DESCRIPTION OF THE INVENTION

The present invention relates to a convenient and piece-of-cake method for closing an open end side of a loaded bag without using a heat sealing or a zipper or the like, and with the result that the closing and opening operation can be conducted in a brief time and the bag is safe from the entrance of foreign material while closed or while being opened; in particular, the bag's open end side is folded three or more times before the folded part is consolidated with an adhesive tape.

Now, the invention will be explained in detail with reference to the drawings.

According to the present invention the open end of the bag is closed in the following manner:

First, a product 1 having a rectangular shape is inserted into a product container bag 2 until one of the product's sides wholly arrives in the bottom of the bag (the left drawing of FIG. 1).

Then, the container bag 2 is folded over a line [the broken line (a) in FIG. 1] that ran in the middle between the open end side 4 of the bag 2 and that side edge 3 of the content (the product 1) which is opposite to the side resting in the bottom of the bag 2, and then the bag 2 is further folded in the same direction as before over a line [the broken line (b) in FIG. 2] that ran in the middle between said line (a) and said side 3 of the pellicle case. Next, the bag 2 is finally folded in the same direction over the side 3 of the pellicle case, and in order to prevent the bag 2 from unfolding and re-opening, the folded part of the bag is securely bandaged onto that part of the bag on which the folded part of the bag is pressed, with an adhesive tape 5 (FIG. 4).

The position at which the adhesive tape 5 is applied can be selected with prudence, and as shown in FIG. 4, it is preferable that the adhesive tape 5 comes in the middle of the folded part of the bag. It is also possible to use more than one strip of adhesive tape.

Incidentally, in the case shown in FIG. 4, the adhesive tape is attached to extend in the depthwise direction of the bag 2, but it is possible to attach the adhesive tape to extend in parallel to the crease line (b).

As the bag is closed by being folded upon itself three folds, the inner walls of the bag choke up the bag so that the external air is stopped from entering the bag. Also, according to this folding method, in order to gain a sufficient air-tightness, it suffices to fold the bag only a few folds.

There is no particular limitation to the product container bag to which the present invention is applicable, so long as the film surface of the bag is smooth and is not formed with embossment or wrinkles; it is preferable also, that such bag is made from a film having a thickness of a certain range and is easy to fold and when folded the inner walls of the bag attach themselves to one another by means of the bending force created by the folding.

A recommended range for the thickness of the film from which the bag is made is 50-200 micrometers.

There is no particular limitation as to the material of which the product container bag is made, and examples include resins such as polyethylene, nylon, polypropylene, and polyester, and it is possible to use a bag made from a sheet of one of these resins of which at least one of the faces is lined with: a metallic thin layer by means of vapor deposition, or an anti-static layer; or it is possible to use a bag made from a sheet which is a multilayer sheet consisting of one or more of the above-mentioned resins.

There is no limitation as to the kind of the adhesive tape used to consolidate the folded opening of the product container bag; however, it is preferred that the tape has an anti-static characteristic so that when the tape is peeled off the product container bag no static is created. Among such adhesive tapes that are on the market, an example is 3250-Static Resistant Polypropylene Packaging Tape manufactured by NITTO DENKO CORPORATION.

EMBODIMENTS

Embodiment 1

We will now describe examples of embodiment of the invention.

A rectangular bag made from a polyethylene film, having a thickness of 70 micrometers, was prepared to contain a rectangular product. This bag's opening was closed in a clean room in the following procedure.

Firstly, an encased pellicle, 6N2HF-EXN (this pellicle and the container case are commercially available in unit from Shin-Etsu Chemical Co., Ltd.), which is rectangular, was inspected for dust particles sticking to it that were 10 micrometers or greater in size, in a dark room by means of a 300,000-lux light condenser lamp. Then, the rectangular product was inserted into the polyethylene bag until one of the product's sides entirely reached the bottom of the bag.

Then, the bag was folded over a line that ran in the middle between the open end side of the bag and that side of the pellicle case which is opposite to the side resting in the bottom of the bag, and then the bag was further folded in the same direction over a line that ran in the middle between said line over which the bag was first folded and said side of the pellicle case opposite to the side in the bag's bottom. Next, the bag was folded again in the same direction along said side of the pellicle case opposite to the side in the bag's bottom, and in order to prevent the bag from re-opening the folded part of the bag was securely bandaged onto that part of the bag on which the folded part of the bag was temporarily pressed, with an adhesive tape. The manner in which the adhesive tape was spanned is shown in FIG. 4, and the length of the adhesive tape was about 40 mm. Incidentally, that end of the adhesive tape 5 which extended beyond the bag was folded partially back in a manner such that the adhesive-coated side of the tape stuck to itself whereby a non-sticky tab was created.

This bag was left alone outside the clean room for a week. Then, it was brought into the clean room and the container case was retrieved from the bag, and it was inspected for particles sticking to it in the dark room in the same manner as described above, and there was observed no increase in the number of the particles that were 10 micrometers or greater in size. Also the time it took to retrieve the container case from the bag was three seconds.

In the similar manner this experiment was repeated changing the number of the folding of the open end of the bag.

Comparative Example 1

A rectangular bag made from polyethylene film, having a thickness of 70 micrometers, was prepared to contain a rectangular product and its opening was closed in a clean room in the following procedure.

After counting the number of particles that were 10 micrometers or greater in size sticking to the surface of the encased pellicle in the same manner as above, the encased pellicle was inserted into the bag until one of the case's side reached the bottom of the bag.

Then, the bag was sealed by heat along a line that ran in the middle between the open side of the bag and that side of the case which is opposite to the side resting in the bottom of the bag. This bag was left alone outside the clean room for a week. Then, the bag was brought into the clean room and was severed by scissors into two parts across a line which is remoter from the mouth of the bag than the heat-sealed line is, whereupon the encased pellicle was retrieved from the bag, and it was inspected for particles sticking to it in the same dark room by the same means.

Three particles were newly found on the surface of the case, which are thought to be generated when the bag was severed.

Also the time it took to retrieve the encased pellicle was ten seconds.

Table 1 shows different manners of closing of the polyethylene film bag and their result in terms of the contamination,

TABLE 1

Manners of closing the bag and the results

| | closing manner | number of folding including final folding over the content edge | Number of particles increased between the two inspections | Time needed to open the bag (seconds) | Time needed to store the content in the bag |
|---|---|---|---|---|---|
| 1 | folding | 2 | 3 | 2 | 3 |
| 2 | folding | 3 | 0 | 3 | 5 |
| 3 | folding | 4 | 0 | 4 | 6 |
| 4 | folding | 5 | 0 | 5 | 8 |
| 5 | folding | 6 | 0 | 6 | 10 |
| 6 | folding | 7 | 0 | 7 | 12 |
| 7 | heat sealing | 0 | 3 | 10 | 15 |
| 8 | fastener | 0 | 0 | 11 | 10 |
| 9 | adhesive tape | 0 | 0 | 10 | 15 |

From the results as shown in Table 1, it was learned that by folding the opening part of the bag three or more times in the manner as described above including the final folding over the side of the hard case which is opposite to the side in the bottom of the bag and fixing the folded part by an adhesive means, it is possible to securely prevent entrance of foreign materials into the bag. The more the folding is repeated the higher the sealing effect of the bag becomes, but the less easy the folding operation gets, and to fold the bag six times or more is a feat and not practical. In the case where the opening of the bag is heat-sealed or equipped with a fastener (zipper) or sealed with an adhesive tape, the sealing effect after closing of the bag is secured high; however, it has been the experience of the inventor that the eventual use of a pair of scissors or a knife to open the heat-sealed bag itself causes dust to occur, and it may be easy to open a zippered bag but not so much so to close it, and it is troublesome to hermetically close a bag with an adhesive tape, which results in a lengthy packing time and low productivity.

INDUSTRIAL APPLICABILITY

By virtue of the method of the present invention, it is possible to store a content air-tightly in a bag with ease without using an extra bag or without modifying the bag, so that the method is applicable to packing of various kinds of products, with the results such as secure packing, easy retrieval, shorter manufacturing time, improved to product quality and reduced cost.

EXPLANATION FOR REFERENCE NUMERALS

1: product
2: container bag for the product
3: side of the product opposite to the side at the bottom of the bag
4: opening (of the bag containing the product)
5: adhesive tape

What is claimed is:

1. A method for air-tightly containing in a rectangular film bag a flat product having at least one pair of parallel sides, comprising steps of:
 (i) inserting, within a clean room, the product into the bag in a manner such that one of the parallel sides of the product comes to a bottom end side of the bag,
 (ii) folding the bag over a line that runs equidistant from an open end side of the bag and the other one of the parallel sides of the product,
 (iii) folding the bag in a same direction as in the step (ii) over a line that runs equidistant from the line over which the bag has been folded immediately previously and the other one of the parallel sides of the product, thereby obtaining a folded bag, and this step being conducted at least one time, and
 (iv) consolidating the folded bag with an adhesive thereby preventing unfolding of the bag.

2. A method as claimed in claim 1, wherein before the step (iv) said bag is folded in the same direction as in the step (ii) over the other one of the parallel sides of the product.

3. A method as claimed in claim 1, wherein said step (iii) is conducted no more than four times.

4. A method as claimed in claim 1, wherein said product is a case containing a pellicle.

5. A method as claimed in claim 1, wherein a width from the other one of the parallel sides of the product to an end of the bag on the open end side becomes ¼ of a width from the other one of the parallel sides of the product to the end of the bag on the open end side before the folding of the step (ii).

6. A pellicle kit consisting of a pellicle and a pellicle case containing said pellicle and a film bag containing said pellicle case,
 wherein said film bag air-tightly contains said pellicle case in a manner as described in claim 1.

7. A method as claimed in claim 5, further comprising applying the adhesive in a direction orthogonal to the parallel sides.

\* \* \* \* \*